United States Patent
Cho

(10) Patent No.: US 9,991,402 B2
(45) Date of Patent: Jun. 5, 2018

(54) SOLAR APPARATUS AND METHOD OF FABRICATING THE SAME

(71) Applicant: LG INNOTEK CO., LTD., Seoul (KR)

(72) Inventor: Ho Gun Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 378 days.

(21) Appl. No.: 14/349,911

(22) PCT Filed: Oct. 4, 2012

(86) PCT No.: PCT/KR2012/008024
§ 371 (c)(1),
(2) Date: Apr. 4, 2014

(87) PCT Pub. No.: WO2013/051849
PCT Pub. Date: Apr. 11, 2013

(65) Prior Publication Data
US 2014/0224324 A1    Aug. 14, 2014

(30) Foreign Application Priority Data

Oct. 4, 2011   (KR) .................. 10-2011-0100849

(51) Int. Cl.
*H01L 31/044* (2014.01)
*H01L 31/0224* (2006.01)
*H01L 31/0465* (2014.01)

(52) U.S. Cl.
CPC .... *H01L 31/02245* (2013.01); *H01L 31/0465* (2014.12); *Y02E 10/50* (2013.01)

(58) Field of Classification Search
USPC .................................. 136/243–265
See application file for complete search history.

(56) References Cited

U.S. PATENT DOCUMENTS

2008/0053519 A1*   3/2008   Pearce ............ H01L 31/022433
136/252
2010/0252109 A1   10/2010   Hong et al.
(Continued)

FOREIGN PATENT DOCUMENTS

| CN | 101980368 A | 2/2011 |
| CN | 102150276 A | 8/2011 |

(Continued)

OTHER PUBLICATIONS

International Search Report in International Application No. PCT/KR2012/008024, filed Oct. 4, 2012.

(Continued)

*Primary Examiner* — Bach T Dinh
(74) *Attorney, Agent, or Firm* — Saliwanchik, Lloyd & Eisenschenk

(57) ABSTRACT

Disclosed are a solar apparatus and a method of fabricating a solar apparatus. The solar apparatus according to the embodiment includes: a substrate; a back electrode layer on the substrate; a plurality of sub-electrodes making direct contact with the back electrode layer and extending in a first direction; a light absorbing layer on the back electrode layer; and a front electrode layer on the light absorbing layer.

7 Claims, 4 Drawing Sheets

(56) References Cited

U.S. PATENT DOCUMENTS

| | | | |
|---|---|---|---|
| 2010/0258179 A1* | 10/2010 | Wieting | H01L 31/022425 136/256 |
| 2010/0300514 A1* | 12/2010 | Denda | H01L 31/022425 136/252 |
| 2012/0174957 A1* | 7/2012 | Nishimura | H01L 31/022425 136/244 |
| 2012/0199191 A1 | 8/2012 | Lim | |

FOREIGN PATENT DOCUMENTS

| | | |
|---|---|---|
| JP | 2004-158661 A | 6/2004 |
| KR | 10-2009-0029883 A | 3/2009 |
| KR | 10-2011-0047726 A | 5/2011 |

OTHER PUBLICATIONS

Office Action dated Oct. 27, 2015 in Korean Application No. 201280059707.9.

Jian, Li Chang, "CIGS Thin Film Solar Cell", Solar Cell Basic and Applied, Oct. 1, 2009, pp. 344-401.

* cited by examiner

[Fig. 1]
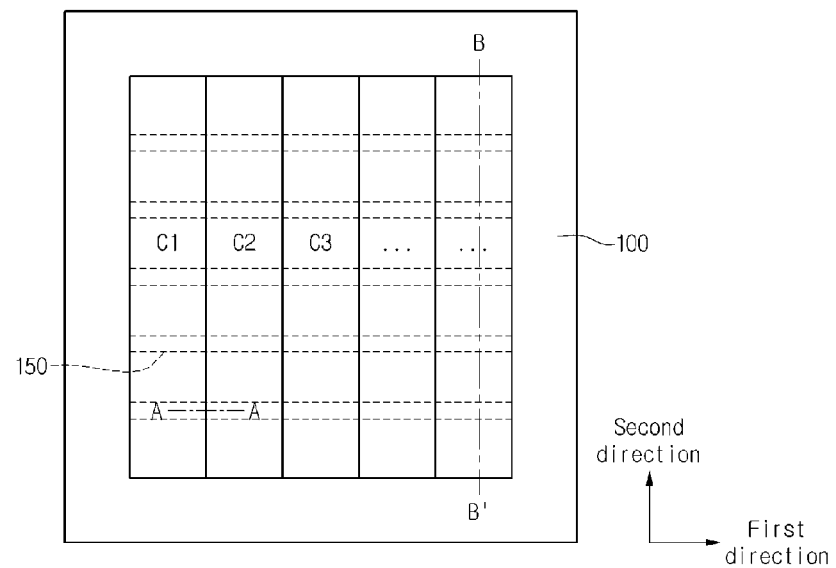
[Fig. 2]
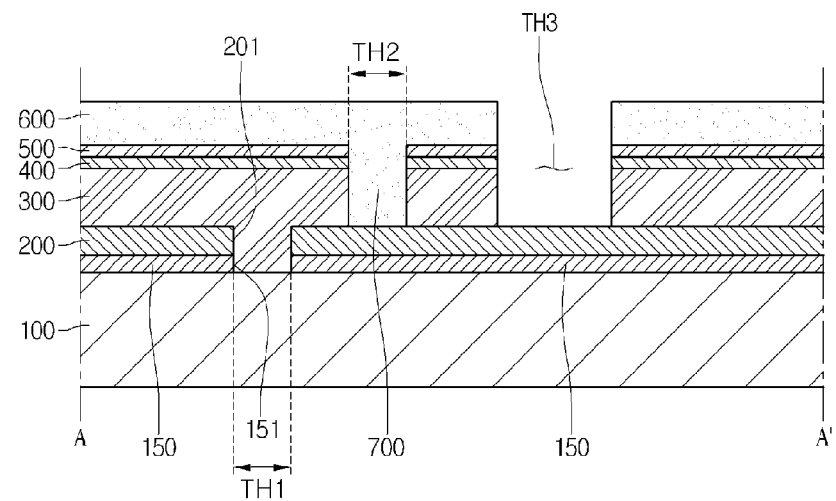
[Fig. 3]
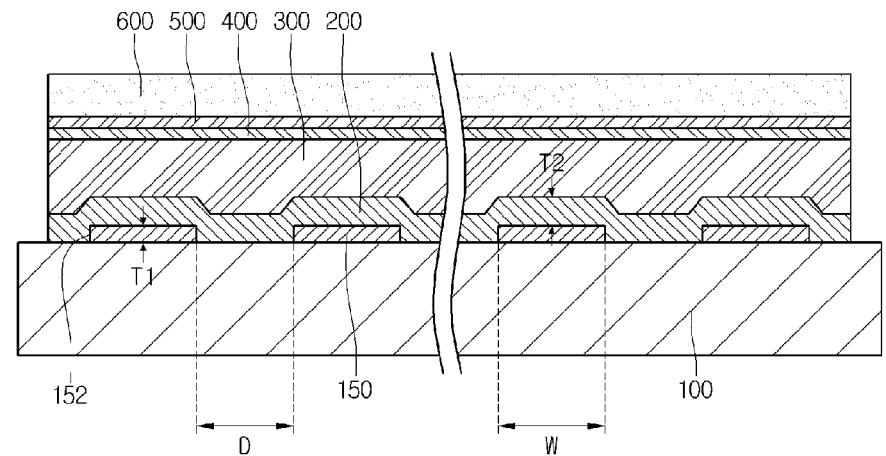

[Fig. 4]
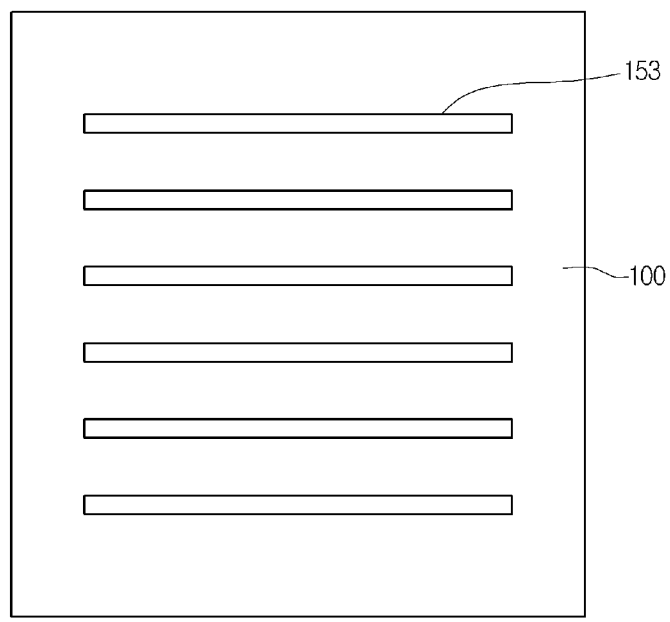
[Fig. 5]
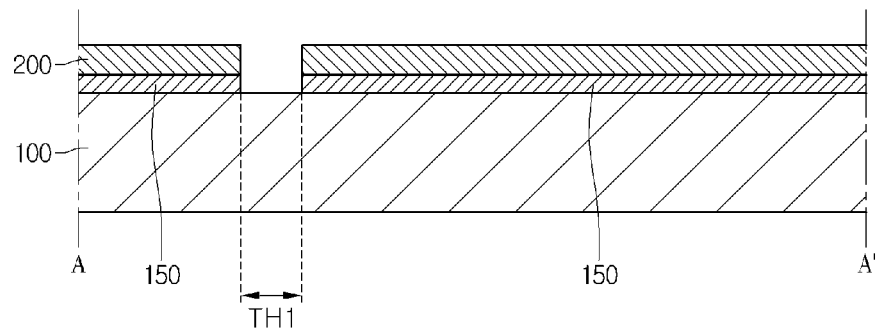
[Fig. 6]
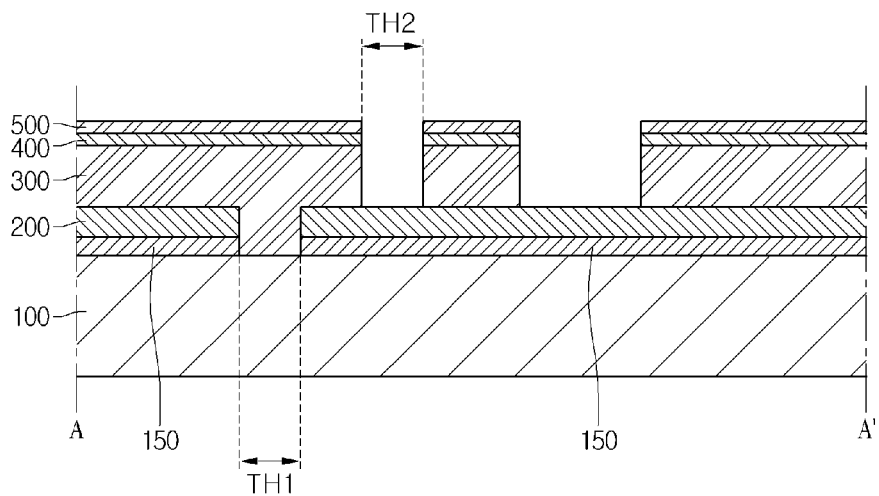

[Fig. 7]
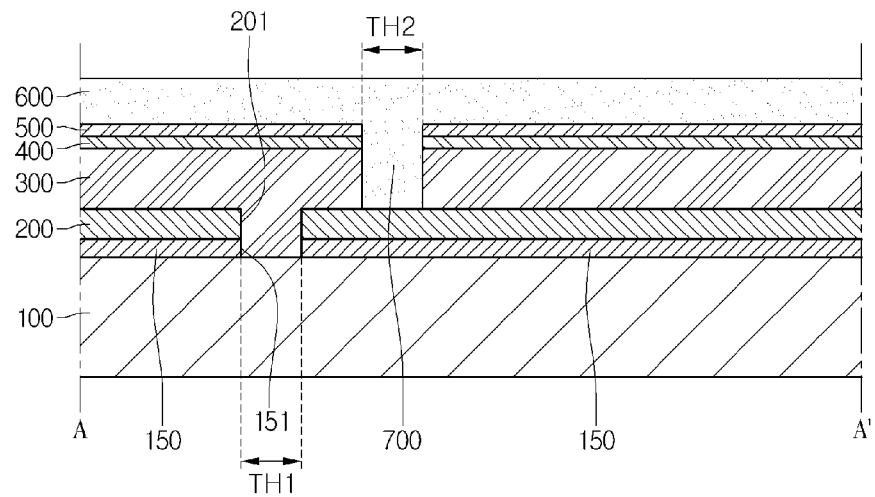
[Fig. 8]
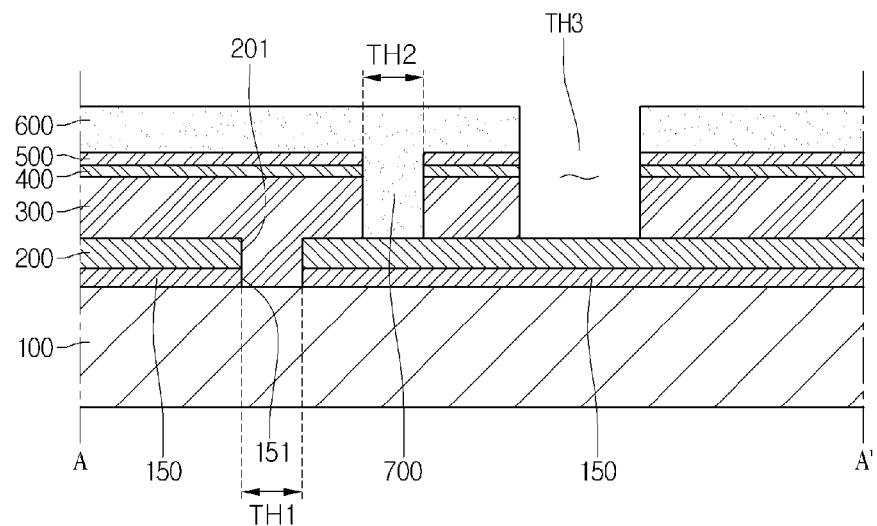
[Fig. 9]
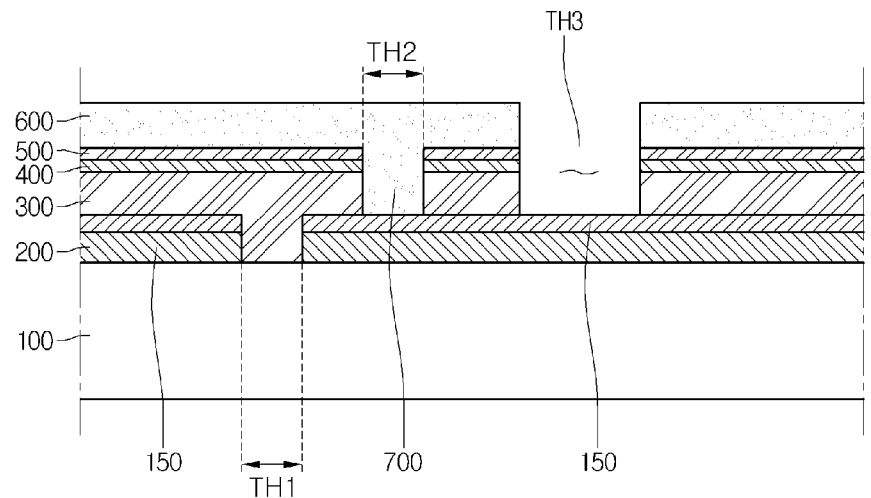

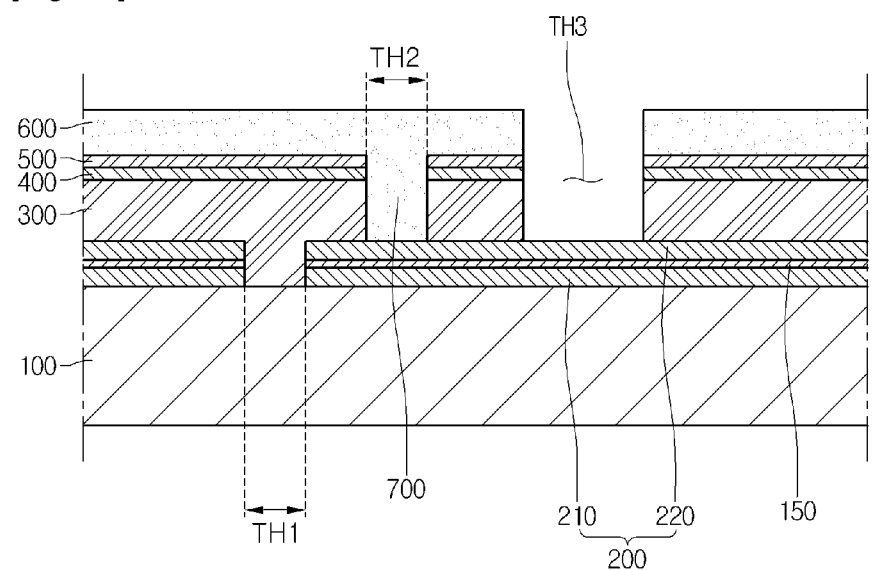
[Fig. 10]

SOLAR APPARATUS AND METHOD OF FABRICATING THE SAME

CROSS-REFERENCE TO RELATED APPLICATIONS

This application is the U.S. national stage application of International Patent Application No. PCT/KR2012/008024, filed Oct. 4, 2012, which claims priority to Korean Application No. 10-2011-0100849, filed Oct. 4, 2011, the disclosures of each of which are incorporated herein by reference in their entirety.

TECHNICAL FIELD

The embodiment relates to a solar apparatus and a method of fabricating the same.

BACKGROUND ART

A solar cell apparatus for converting sunlight into electrical energy includes a solar cell panel, a diode, and a frame.

The solar cell panel has a plate shape. For example, the solar cell panel has a rectangular plate shape. The solar cell panel is disposed inside the frame. Four side surfaces of the solar cell panel are disposed inside the frame.

The solar cell panel receives sunlight, and converts the sunlight into electrical energy. The solar cell panel includes a plurality of solar cells. The solar cell panel may further include a substrate, a film, or protective glass for protecting the solar cells.

The solar cell panel includes bus bars connected to the solar cells. The bus bars extend from upper surfaces of outermost solar cells and are connected to wires, respectively.

The diode is connected to the solar cell panel in parallel. A current selectively flows through the diode. That is, when a performance of the solar cell panel deteriorates, a current flows through the diode. Accordingly, a short circuit of the solar cell apparatus according to the embodiment is prevented. The solar cell apparatus may further include wires connected to the diode and the solar cell panel. The wires connect solar cell panels adjacent to each other.

The frame accommodates the solar cell panel therein. The frame is made of a metal. The frame is disposed on a side surface of the solar cell panel. The frame accommodates a side surface of the solar cell panel therein. The frame may include a plurality of sub-frames. In this case, the sub-frames may be connected to each other.

Such a solar cell apparatus is mounted in the outdoor field to convert sunlight into electrical energy. Thus, the solar cell apparatus may be exposed to the external physical impact, electric impact and chemical impact.

A technology related to such a solar cell apparatus is disclosed in Unexamined Korean Patent Application No. 10-2009-0059529.

DISCLOSURE OF INVENTION

Technical Problem

The embodiment provides a solar apparatus which may have improved electrical and physical characteristics and can be easily fabricated and a method of fabricating the same.

Solution to Problem

A solar apparatus according to the embodiment includes: a substrate; a back electrode layer on the substrate; a plurality of sub-electrodes making direct contact with the back electrode layer and extending in a first direction; a light absorbing layer on the back electrode layer; and a front electrode layer on the light absorbing layer.

A method of fabricating a solar apparatus according to the embodiment includes the steps of: forming a plurality of sub-electrodes on a substrate; forming a back electrode layer which makes contact with the sub-electrodes on the substrate; forming a light absorbing layer on the back electrode layer; and forming a front electrode layer on the light absorbing layer.

Advantageous Effects of Invention

According to the solar apparatus of the embodiment, electrical characteristics of the back electrode layer can be improved through the sub-electrodes making direct contact with the back electrode layer. Specifically, the sub-electrodes can include a metal having lower resistance than that of the back electrode layer. Specifically, in the solar apparatus according to the embodiment, the sub-electrodes may extend in a current flowing direction. Therefore, the sub-electrodes can improve the electrical characteristics of the solar apparatus according to the embodiment.

Thus, the solar apparatus can reduce the thickness of the back electrode layer. Specifically, when molybdenum is used for the back electrode layer, the thickness of the back electrode layer can be reduced so that the solar apparatus can be easily fabricated at the low cost.

Further, the sub-electrodes can be spaced apart from each other. Thus, thermal stress between the sub-electrodes and the substrate can be relieved. Thus, the solar apparatus according to the embodiment can represent improved reliability and improved durability.

BRIEF DESCRIPTION OF DRAWINGS

FIG. 1 is a plane view showing a solar apparatus according to the embodiment;

FIG. 2 is a sectional view taken long line A-A' of FIG. 1;

FIG. 3 is a sectional view taken long line B-B' of FIG. 1;

FIGS. 4 to 8 are views illustrating a procedure of fabricating solar apparatus according to the embodiment;

FIG. 9 is a sectional view showing a solar apparatus according to another embodiment; and FIG. 10 is a sectional view showing a solar apparatus according to still another embodiment.

MODE FOR THE INVENTION

In the description of the embodiments, it will be understood that, when a substrate, a film, a layer, or an electrode is referred to as being "on" or "under" another substrate, film, layer, or electrode, it can be "directly" or "indirectly" on the other substrate, film, layer, or electrode, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

FIG. 1 is a plan view showing a solar apparatus according to the embodiment. FIG. 2 is a sectional view taken along line A-A' of FIG. 1. FIG. 3 is a sectional view taken along line B-B' of FIG. 1.

Referring to FIGS. 1 to 3, the solar apparatus includes a support substrate 100, a plurality of sub-electrodes 150, a back electrode layer 200, a light absorbing layer 300, a buffer layer 400, a high resistance buffer layer 500, a front electrode layer 600, and a plurality of connection parts 700.

The support substrate 100 has a plate shape and supports the back electrode layer 200, the light absorbing layer 300, the buffer layer 400, the high resistance buffer layer 500, the front electrode layer 600, and a plurality of connection parts 700.

The support substrate 100 may include an insulator. The support substrate 100 may include a glass substrate, a plastic substrate, or a metallic substrate. In more detail, the support substrate 100 may include a soda lime glass substrate. The support substrate 100 may be transparent or may be rigid or flexible.

The sub-electrodes 150 are disposed on the support substrate 100. The sub-electrodes 150 extend in a first direction. The sub-electrodes 150 may be disposed in a raw in the first direction.

Further, the sub-electrodes 150 are spaced apart from each other. Further, the sub-electrodes 150 are disposed in parallel to each other. The sub-electrodes 150 may be disposed in parallel with each other. Further, the sub-electrodes 150 may have a width W in the range of about 1 mm to about 3 mm. Further, a distance between the sub-electrodes 150 may be in the range of about 80 mm to 150 mm.

Thus, since the sub-electrodes 150 are spaced apart from each other, delamination of the sub-electrodes 150 may be restrained. Specifically, since the sub-electrodes 150 are not formed on a front surface, delamination by the difference between thermal expansion coefficients of the sub-electrodes 150 and the support substrate 100 may be restrained.

The sub-electrodes 150 are interposed between the support substrate 100 and the back electrode layer 200. The sub-electrodes 150 make direct contact with the bottom surface of the back electrode substrate 200. Further, the sub-electrodes 150 make direct contact with the top surface of the support layer 100. A thickness T1 of the sub-electrodes 150 may be in the range of about 50 nm to about 100 nm.

The sub-electrodes 150 may include a metal having low resistance. In more detail, the sub-electrodes 150 may include a metal having lower resistance than that of a material used for the back electrode layer 200. The material used for the sub-electrodes 150 may include silver or copper.

The back electrode layer 200 is disposed on the support substrate 100. In more detail, the back electrode layer 200 is disposed on the sub-electrodes 150. That is, the back electrode layer 200 covers the sub-electrodes 150. Specifically, the back electrode layer 200 covers a side surface 152 of the sub-electrodes 150. The back electrode layer 200 may make direct contact with the top surface of the support substrate 100 and the side surface 152 of the sub-electrodes 150.

The back electrode layer 200 makes direct contact with the sub-electrodes 150. In more detail, the back electrode layer 200 makes direct contact with the top surfaces of the sub-electrodes 150. That is, the back electrode layer 200 is connected directly and electrically to the sub-electrodes 150.

The back electrode layer 200 may be a conductive layer. The back electrode layer 200 may include a metal, such as molybdenum (Mo).

Since the sub-electrodes 150 supplements the electrical characteristics of the back electrode layer 200, the back electrode layer 200 may be formed at a thinner thickness. Specifically, the back electrode layer 200 is formed of molybdenum, and when the sub-electrodes 150 is formed of a low resistance metal such as silver or copper, the thickness of the back electrode layer 200 may become thin. At this time, the thickness of the back electrode layer 200 may be in the range of about 100 nm to about 300 nm.

In addition, the back electrode layer 200 may include at least two layers. In this case, the layers may be formed by using the homogeneous metal or heterogeneous metals.

The back electrode 200 is provided therein with first through holes TH1. The first through holes TH1 are open regions to expose the top surface of the support substrate 100. When viewed in a plan view, the first through holes TH1 may have a shape extending in a second direction.

The first through holes TH1 are formed through the sub-electrodes 150. That is, the inner side surface 201 of each of the first through holes TH1 and a tip end surface 151 of each of the sub-electrodes 150 may be aligned on the same plane. That is, the sub-electrodes 150 may be electrically insulated from each other by the first through holes TH1.

The first through holes TH1 may have a width in the range of about 80 μm to about 200 μm.

The back electrode layer 200 is divided into a plurality of back electrodes by the first through holes TH1. That is, the back electrodes are defined by the first through holes TH1.

The back electrodes are spaced apart from each other by the first through holes TH1. The back electrodes are arranged in the form of a stripe.

To the contrary, the back electrodes may be arranged in the form of a matrix. In this case, when viewed in a plan view, the first through holes TH1 may be provided in the form of a lattice.

The light absorbing layer 300 is provided on the back electrode layer 200. In addition, a material constituting the light absorbing layer 300 is filled in the first through holes TH1.

The light absorbing layer 300 includes a group I-III-VI compound. For example, the light absorbing layer 300 may have a Cu(In,Ga)Se2 (CIGS) crystal structure, a Cu(In)Se2 crystal structure, or a Cu(Ga)Se2 crystal structure.

The light absorbing layer 300 has an energy bandgap in the range of about 1 eV to about 1.8 eV.

The buffer layer 400 is provided on the light absorbing layer 300. The buffer layer 400 includes CdS and has an energy bandgap in the range of about 2.2 eV to about 2.4 eV.

The high resistance buffer layer 500 is provided on the buffer layer 400. The high-resistance buffer layer 500 may include iZnO, which is zinc oxide not doped with impurities. The high resistance buffer layer 500 has an energy bandgap in the range of about 3.1 eV to about 3.3 eV.

The light absorbing layer 300, the buffer layer 400, and the high resistance buffer layer 500 are formed therein with the second through holes TH2. The second through holes TH2 are formed through the light absorbing layer 300. In addition, the second through holes TH2 are open regions to expose the top surface of the back electrode layer 200.

The second through holes TH2 are adjacent to the first through holes TH1. In other words, when viewed in a plan view, portions of the second through holes TH2 are formed beside the first through holes TH1. The second through holes TH2 has a shape extending in the second direction.

Each second through holes TH2 may have a width in the range of about 80 μm to about 200 μm.

A plurality of light absorbing parts are defined in the light absorbing layer 300 by second through holes TH2. In other words, the light absorbing layer 300 is divided into the light absorbing parts by the second through holes TH2.

A plurality of buffers are defined in the buffer layer 400 by second through holes TH2. In other words, the buffer layer 400 is divided into the buffers by the second through holes TH2.

A plurality of high resistance buffers are defined in the high resistance buffer layer 500 by second through holes TH2. In other words, the high resistance buffer layer 500 is divided into the high resistance buffers by the second through holes TH2.

The front electrode layer 600 is disposed on the high resistance buffer layer 500. The front electrode layer 600 is transparent, and includes a conductive layer. Further, the resistance of the front electrode layer 600 is higher than that of the back electrode layer 200.

The front electrode layer 600 may include oxide. For example, a material used for the front electrode layer 600 may include Al doped zinc oxide (AZO), or Ga doped zinc oxide (GZO).

The light absorbing layer 300, the buffer layer 400, the high resistance buffer layer 500 and the front electrode layer 600 are formed therein with the third through holes TH3. The third through holes TH3 are formed through the light absorbing layer 300, the buffer layer 400, the high resistance buffer layer 500 and the front electrode layer 600.

The third through holes TH3 are adjacent to the second through holes TH2. In detail, the third through holes TH3 are disposed beside the second through holes TH2. In other words, when viewed in a plan view, the third through holes TH3 are disposed in parallel to each other beside the second through holes TH2. The third through holes TH3 may have a shape extending in the second direction.

The front electrode layer 600 is divided into a plurality of front electrodes by the third through holes TH3. That is, the front electrodes are defined by the third through holes TH3.

The front electrodes have a shape corresponding to that of the back electrodes. That is, the front electrodes are disposed in the form of a stripe. Alternatively, the front electrodes may be disposed in the form of a matrix.

A plurality of cells C1, C2, . . . and CN are defined by the third through holes TH3. In more detail, the cells C1, C2, . . . and CN are defined by the second and third through holes TH2 and TH3. That is, the solar apparatus according to the embodiment are divided into the cells C1, C2, . . . and CN by the second and third through holes TH2 and TH3. The cells C1, C2, . . . and CN are connected to each other in the first direction crossing the second direction. That is, a current may flow in the first direction through the cells C1, C2, . . . and CN.

The connection parts 700 are disposed at the inside of the second through holes TH2. Each connection part 700 extends downward from the front electrode layer 600 and is connected to the back electrode layer 200. For example, each connection part 700 extends from a front electrode of the first cell C1 and is connected to a back electrode of the second cell C2.

Thus, the connection parts 700 connect adjacent cells to each other. In more detail, the connection parts 700 connect front electrodes and back electrodes included in adjacent cells to each other.

Each connection part 700 is integrally formed with the front electrode layer 600. That is, a material constituting the connection part 700 is identical to a material constituting the front electrode layer 600.

As described above, according to the solar apparatus of the embodiment, electrical characteristics of the back electrode layer 200 can be improved through the sub-electrodes making direct contact with the back electrode layer 200. Specifically, the sub-electrodes 150 can include a metal having lower resistance than that of the back electrode layer 200. Specifically, in the solar apparatus according to the embodiment, the sub-electrodes 150 may extend in a current flowing direction. Therefore, the sub-electrodes can improve the electrical characteristics of the solar apparatus according to the embodiment.

Thus, the solar apparatus can reduce the thickness of the back electrode layer 200. Specifically, when molybdenum is used for the back electrode layer 200, the thickness of the back electrode layer 200 can be reduced so that the solar apparatus can be easily fabricated at the low cost. That is, since the use of molybdenum of a high price can be reduced in the solar apparatus of the embodiment, the solar apparatus can be easily fabricated at the low cost.

Further, the sub-electrodes 150 can be spaced apart from each other. Thus, thermal stress between the sub-electrodes 150 and the substrate 100 can be relieved. Therefore, the solar apparatus according to the embodiment can represent improved reliability and improved durability.

FIGS. 4 to 8 are sectional views illustrating a method for fabricating a solar apparatus according to the embodiment. The description related to the fabricating method will be made based on the above description about the solar cell. The above description about the solar cell will be essentially incorporated herein by reference.

Referring to FIG. 4, a plurality of preliminary sub-electrodes 153 are formed on the support substrate 100. The preliminary sub-electrodes 153 extend in the first direction. In more detail, the preliminary sub-electrodes 153 cross the support substrate 100.

A metal such as silver or copper may be selectively deposited on the upper surface of the support substrate 100 through a mask in order to form the preliminary sub-electrodes 153. That is, the preliminary sub-electrodes 153 may be spaced in parallel apart from each other in a predetermined distance.

Referring to FIG. 5, a metal such as molybdenum is deposited on the support substrate 100 and the preliminary sub-electrodes 153 to form the back electrode layer 200. Then, the back electrode layer 200 and the preliminary sub-electrodes 153 are patterned to form the first through holes TH1. Thus, the back electrodes are formed on the support substrate 100. At this time, the preliminary sub-electrodes 153 are also patterned to form the sub-electrodes 150. The back electrode layer 200 and the preliminary sub-electrodes 153 may be patterned by a laser device.

The top surface of the support substrate 100 is exposed through the first through holes TH1, and the width of the first through holes TH1 may be in the range of about 80 μm to about 200 μm.

Referring to FIG. 6, the light absorbing layer 300, the buffer layer 400, and the high resistance buffer layer 500 are formed on the back electrode layer 200.

The light absorbing layer 300 may be formed through the sputtering process or the evaporation scheme.

For example, the light absorbing layer 300 may be formed through various schemes such as a scheme of forming a Cu(In,Ga)Se2 (CIGS) based light absorbing layer 300 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, a Ga target or an alloy target.

Thereafter, the metallic precursor layer is subject to the selenization process so that the Cu (In, Ga) Se2 (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

Thereafter, the buffer layer 400 is formed by depositing CdS through a sputtering process or a chemical bath deposition (CBD) scheme.

Then, the high resistance buffer layer 500 is formed by depositing zinc oxide on the buffer layer 400 through a sputtering process.

The buffer layer 400 and the high resistance buffer layer 500 are formed at a low thickness. For example, the buffer layer 400 and the high resistance buffer layer 500 have a thickness in the range of about 1 nm to about 80 nm.

Thereafter, the second through holes TH2 are formed by removing portions of the light absorbing layer 300, the buffer layer 400, and the high resistance buffer layer 500.

The second through holes TH2 may be formed by using a mechanical device such as a tip or a laser device.

For example, the light absorbing layer 300 and the buffer layer 400 may be patterned by a tip having a width in a range of about 40 μm to about 180 μm.

In this case, the second through holes TH2 may have a width in the range of about 100 μm to about 200 μm. In addition, the second through holes TH2 expose a portion of the top surface of the back electrode layer 200.

Referring to FIG. 7, the front electrode layer is formed on the light absorbing layer 300 and in the second through holes TH2. In other words, the front electrode layer is formed by depositing a transparent conductive material on the high resistance buffer layer 500 and in the second through holes TH2.

For example, the front electrode layer may be formed by depositing AZO on the top surface of the high resistance buffer layer 500 and in the second through holes TH2 through the sputtering process.

In this case, the transparent conductive material is filled in the second through holes TH2, and the front electrode layer makes direct contact with the back electrode layer 200.

Referring to FIG. 8, the front electrode layer, the light absorbing layer 300, the buffer layer and the high resistance buffer layer are patterned by a mechanical scheme. Thus, the third through holes TH3, which are formed through the front electrode layer, the high resistance buffer layer 500, the buffer layer 400 and the light absorbing layer 300, are formed. In this case, the front electrode layer is divided into a plurality of front electrodes by the third through holes TH3.

That is, the plurality of cells C1, C2 . . . , and CN are defined in the front electrode layer 600 by the third through holes TH3. The third through holes TH3 may have a width in the range of about 80 μm to about 200 μm.

As described above, the method of fabricating a solar apparatus according to the embodiment can provide a solar apparatus having improved electrical characteristics.

FIG. 9 is a sectional view showing a solar apparatus according to another embodiment. FIG. 10 is a sectional view showing a solar apparatus according to still another embodiment. The embodiment refers to the above description about the solar apparatus and the method of fabricating the same. That is, the above description about the solar apparatus and the method of fabricating the same may be essentially combined with the embodiment except for any changed parts.

Referring to FIG. 9, the sub-electrodes 150 is interposed between back electrode layer 200 and the light absorbing layer 300. The sub-electrodes 150 make direct contact with the top surface of the back electrode layer 200. The sub-electrodes 150 may make direct contact with the light absorbing layer 300.

In the embodiment, the sub-electrodes 150 do not make direct contact with the top surface of the support substrate 100. Specifically, the sub-electrodes 150 make contact with the support substrate 100 through the back electrode layer 200 including molybdenum. Thus, delamination between the sub-electrodes 150 and the support substrate 100 may be restrained.

Referring to FIG. 10, the sub-electrodes 150 may be disposed in the back electrode layer 200. The back electrode layer 200 includes a first back electrode layer 210 on the support substrate 100 and a second back electrode layer 200 on the second back electrode layer 220.

The sub-electrodes 150 are interposed between the first and second back electrode layers 210 and 220. The thickness of the first back electrode layer 210 may be in the range of about 50 nm to about 150 nm. Further, the thickness of the second back electrode layer 220 may be in the range of about 50 nm to about 150 nm.

The sub-electrodes 150 make direct contact with the first and second back electrode layers 210 and 220. The sub-electrodes 150 make direct contact with the top surface of the first back electrode layer 210 and the bottom surface of the second back electrode layer 220.

The second back electrode layer 220 covers the top and side surfaces of the sub-electrodes 150. Further, the second back electrode layer 220 may make direct contact with the top surface of the first back electrode layer 210.

In the embodiment, the sub-electrodes 150 do not make direct contact with the top surface of the support substrate 100. Specifically, the sub-electrodes 150 make contact with the support substrate 100 through the first back electrode layer 210 including molybdenum. Thus, delamination between the sub-electrodes 150 and the support substrate 100 may be restrained.

In addition, the sub-electrodes 150 do not make direct contact with the bottom surface of the light absorbing layer 300. Specifically, the sub-electrodes 150 make contact with the light absorbing layer 300 through the second back electrode layer 220. Thus, the sub-electrodes 150 may not interfere with the generation of molybdenum selenium between the light absorbing layer 300 and the second back electrode layer 220.

Further, the features, structures, and effects described in the above embodiments are included in at least one embodiment of the present invention, and are not necessarily limited to only one embodiment. Moreover, the features, structures, and effects described in the embodiments may also be combined or modified to be carried out in other embodiments by those skilled in the art to which the embodiments pertain. Thus, the contents related to the combination and modification shall be construed to be included in the scope of the present invention.

Although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

The invention claimed is:

1. A solar apparatus comprising:
a substrate;
a molybdenum layer on the substrate and comprising molybdenum electrodes;
a plurality of sub-electrodes making direct contact with the molybdenum layer and extending in a first direction;
a plurality of first through holes formed through the molybdenum layer;
a light absorbing layer on the molybdenum layer;
a buffer layer on the light absorbing layer;
a plurality of second through holes formed through the light absorbing layer and the buffer layer;
a front electrode layer on the buffer layer; and
a plurality of third through holes formed through the light absorbing layer, the buffer layer, and the front electrode layer;
wherein a plurality of cells are defined by the third through holes,
wherein each molybdenum electrode of the molybdenum layer extends in a second direction crossing the first direction,
wherein the molybdenum layer has a thickness in a range of from 100 nm to 200 nm,
wherein the molybdenum layer includes:
a first molybdenum layer on the substrate, and
a second molybdenum layer on the first molybdenum layer;
wherein the second molybdenum layer consists of only molybdenum,
wherein each of the first and second molybdenum layers has a thickness in a range of from 50 nm to 100 nm,
wherein the plurality of sub-electrodes are interposed between the first molybdenum layer and the second molybdenum layer,
wherein the second molybdenum layer makes direct contact with top surfaces and side surfaces of each of the sub-electrodes of the plurality of sub-electrodes,
wherein a portion of a tip end surface of a sub-electrode of the plurality of sub-electrodes, a tip end surface of the first molybdenum layer, and a tip end surface of the second molybdenum layer exposed through the first through hole make direct contact with a portion of the light absorbing layer;
wherein the plurality of sub-electrodes include a metal having a resistance lower than a resistance of molybdenum,
wherein the front electrode layer is transparent, and
wherein the plurality of sub-electrodes are spaced apart from the front electrode layer.

2. The solar apparatus of claim 1, wherein the plurality of first through holes extend in the second direction.

3. The solar apparatus of claim 2, wherein an inner surface of each of the first through holes is aligned on a same plane with a tip end surface of each of the sub-electrodes.

4. The solar apparatus of claim 1, wherein the sub-electrode metal is silver or copper.

5. The solar apparatus of claim 1, wherein the sub-electrodes make direct contact with the top surface of the first molybdenum layer and a bottom surface of the second molybdenum layer.

6. The solar apparatus of claim 1, wherein the second back electrode layer covers the top and the side surfaces of the sub-electrodes.

7. The solar apparatus of claim 1, wherein seen in plan view, a surface area of the molybdenum electrodes of the molybdenum layer is greater than a surface area of the plurality of sub-electrodes.

* * * * *